United States Patent
Lee et al.

(10) Patent No.: US 9,461,275 B2
(45) Date of Patent: Oct. 4, 2016

(54) SUBSTRATE FOR ORGANIC ELECTRONIC DEVICE

(71) Applicant: LG DISPLAY CO., LTD., Seoul (KR)

(72) Inventors: Yeon Keun Lee, Daejeon (KR); Yong Sik Ahn, Seoul (KR); Jung Doo Kim, Daejeon (KR); Min Choon Park, Daejeon (KR); Ji Hee Kim, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/255,493

(22) Filed: Apr. 17, 2014

(65) Prior Publication Data

US 2014/0225098 A1   Aug. 14, 2014

Related U.S. Application Data

(63) Continuation of application No. PCT/KR2012/008361, filed on Oct. 15, 2012.

(30) Foreign Application Priority Data

Oct. 17, 2011   (KR) .................. 10-2011-0105957
Oct. 8, 2012   (KR) .................. 10-2012-0111540

(51) Int. Cl.
*H01L 29/08*   (2006.01)
*H01L 35/24*   (2006.01)
(Continued)

(52) U.S. Cl.
CPC .......... *H01L 51/5268* (2013.01); *G02B 5/0268* (2013.01); *G02B 5/0273* (2013.01); *H05B 33/22* (2013.01); *H01L 51/5237* (2013.01); *H01L 51/56* (2013.01)

(58) Field of Classification Search
CPC ...... H05B 33/22; H05B 33/02; H05B 33/10; H01L 51/5268; H01L 51/56; H01L 51/5237; H01L 51/5281; H01L 51/52; H01L 51/5275; H01L 51/448; H01L 51/5271; H01L 51/5246; H01L 51/5253; H01L 51/525; H01L 33/10; H01L 33/46; H01L 33/405; G02B 5/3033; G02B 5/0268; G02B 5/0284; G02B 5/021; G02B 5/0226; G02F 1/133533; G02F 2203/03; H01S 5/12; H01S 5/30
See application file for complete search history.

(56) References Cited

U.S. PATENT DOCUMENTS 6,226,890 B1   5/2001   Boroson et al.
6,661,029 B1 *  12/2003   Duggal .................... 257/89
(Continued)

FOREIGN PATENT DOCUMENTS

JP   11-329742 A   11/1999
JP   2000-145627 A   5/2000
(Continued)

*Primary Examiner* — Jarrett Stark
(74) *Attorney, Agent, or Firm* — Dentons US LLP

(57) ABSTRACT

The present application relates to a substrate for an organic electronic device, an organic electronic device, a method of preparing the substrate or the device, and a lighting apparatus. The substrate for an organic electronic device of the present application may, for example, be used to fabricate an organic electronic device, to which foreign substances such as moisture and oxygen are not permeated, and which has enhanced durability and superior light extraction efficiency. If the organic electronic device includes an encapsulation structure, the substrate may be stably attached to the encapsulation structure, and a surface hardness of outside connector part of the organic electronic device may be maintained to an appropriate level.

17 Claims, 13 Drawing Sheets

(51) Int. Cl.
  *H01L 51/00* (2006.01)
  *H01L 51/52* (2006.01)
  *H05B 33/22* (2006.01)
  *G02B 5/02* (2006.01)
  *H01L 51/56* (2006.01)

(56) References Cited

U.S. PATENT DOCUMENTS

| | | | |
|---|---|---|---|
| 6,808,828 B2 | 10/2004 | Ohata | |
| 6,825,983 B2 * | 11/2004 | Bourdelais et al. | 359/586 |
| 6,841,949 B2 * | 1/2005 | Duggal | 315/169.3 |
| 7,133,032 B2 * | 11/2006 | Cok | 345/175 |
| 7,276,848 B2 * | 10/2007 | Cok et al. | 313/504 |
| 2003/0184219 A1 * | 10/2003 | Duggal et al. | 313/506 |
| 2004/0217702 A1 * | 11/2004 | Garner et al. | 313/512 |
| 2005/0073228 A1 * | 4/2005 | Tyan et al. | 313/110 |
| 2006/0186802 A1 * | 8/2006 | Cok et al. | 313/506 |
| 2006/0220509 A1 * | 10/2006 | Ghosh et al. | 313/110 |
| 2006/0220539 A1 * | 10/2006 | Cok et al. | 313/506 |
| 2007/0013293 A1 * | 1/2007 | Cok | 313/504 |
| 2007/0257608 A1 * | 11/2007 | Tyan et al. | 313/506 |
| 2008/0169758 A1 * | 7/2008 | Cok | 313/506 |
| 2008/0237611 A1 * | 10/2008 | Cok et al. | 257/79 |
| 2008/0278063 A1 * | 11/2008 | Cok | 313/500 |
| 2008/0297029 A1 * | 12/2008 | Cok | 313/498 |
| 2010/0253225 A1 * | 10/2010 | Lifka et al. | 315/112 |
| 2010/0326519 A1 * | 12/2010 | Tanase et al. | 136/257 |
| 2011/0024779 A1 * | 2/2011 | Nakamura et al. | 257/98 |
| 2011/0050082 A1 * | 3/2011 | Inoue et al. | 313/483 |
| 2011/0147721 A1 | 6/2011 | Han | |
| 2011/0248256 A1 * | 10/2011 | Cok et al. | 257/40 |
| 2011/0266577 A1 * | 11/2011 | Kim et al. | 257/98 |
| 2013/0026461 A1 * | 1/2013 | Nakamura | 257/40 |
| 2013/0153866 A1 * | 6/2013 | Chen et al. | 257/40 |

FOREIGN PATENT DOCUMENTS

| | | | | |
|---|---|---|---|---|
| JP | 2001-252505 A | | 9/2001 | |
| JP | 2003-057413 A | | 2/2003 | |
| JP | 2004-22438 A | | 1/2004 | |
| JP | 2005-108678 A | | 4/2005 | |
| JP | 2009-004275 A | | 1/2009 | |
| JP | 2009-76452 A | | 4/2009 | |
| JP | 2010-182449 A | | 8/2010 | |
| JP | PCTJP2011058853 | * | 4/2011 | H01L 51/50 |
| JP | 2011-126097 A | | 6/2011 | |
| KR | 10-2006-0094742 A | | 8/2006 | |
| KR | 10-2011-0062236 A | | 6/2011 | |
| TW | 2007-46893 A | | 12/2007 | |
| TW | 2009-08780 A | | 2/2009 | |
| TW | 2010-41205 A | | 11/2010 | |
| WO | 2011-126097 A1 | | 10/2011 | |

* cited by examiner

SUBSTRATE FOR ORGANIC ELECTRONIC DEVICE

CROSS-REFERENCE TO RELATED APPLICATION

This application is a Continuation Bypass Application of International Patent Application No. PCT/KR2012/008361, filed on Oct. 15, 2012, and claims the benefit of Korean Patent Application Nos. 10-2011-0105957, filed on Oct. 17, 2011 and 10-2012-0111540, filed on Oct. 8, 2012, in the Korean Intellectual Property Office, all of which are incorporated herein by reference in their entirety.

BACKGROUND

1. Field

The present application relates to a substrate for an organic electronic device, an organic electronic device, a method of preparing the device or the substrate, and a lighting apparatus.

2. Related Art

An organic electronic device (OED) is a device including at least one organic material layer which is capable of conducting a current. Types of organic electronic devices include an organic light-emitting device (OLED), an organic solar cell, an organic photo-conductor (OPC) and an organic transistor.

An organic light-emitting device, which is a representative organic electronic device, usually includes a base layer, a first electrode layer, an organic layer and a second electrode layer in this order.

In a structure known as a bottom-emitting device, the first electrode layer may be formed as a transparent electrode layer, and the second electrode layer may be formed as a reflective electrode layer. In a structure known as a top-emitting device, the first electrode layer may be formed as a reflective electrode layer, and the second electrode layer may be formed as a transparent electrode layer.

Electrons and holes injected by the electrode layers are recombined in a light-emitting layer in the organic layer to produce photons. The photons may be emitted toward the substrate in the case of the bottom-emitting device, whereas the photons may be emitted toward the second electrode layer in the case of the top-emitting device. Refractive indexes of indium tin oxide (ITO), which is conventionally used as the transparent electrode layer, the organic layer and the base layer, which is conventionally a glass, are approximately 2.0, 1.8 or 1.5, respectively, in the organic light-emitting device structure. Due to the relation of these refractive indexes, for example, the photons produced in the light-emitting layer of the bottom-emitting device may be trapped by a total internal reflection in an interface between the organic layer and the first electrode layer or in the base layer, and therefore only a very small amount of photons is emitted.

Another important issue to be considered in the organic light-emitting device is durability. Since the organic layer or the electrode layer may be very easily oxidized by foreign substances, such as moisture and oxygen, it is important to secure the durability against environmental factors. For this issue, for example, U.S. Pat. Nos. 6,226,890 and 6,808,828, and Japanese Patent Laid-open Publication Nos. 2000-145627 and 2001-252505 suggested the structure which may block the introduction of foreign substances.

SUMMARY

The present application provides a substrate for an organic electronic device (OED), an organic electronic device (OED), a method of preparing the substrate or the organic electronic device, and a lighting apparatus.

DETAILED DESCRIPTION OF ILLUSTRATIVE EMBODIMENTS

An illustrative substrate for an organic electronic device includes a base layer; a light scattering layer and an electrode layer. In the above, the light scattering layer and the electrode layer may be formed on the base layer in this order, and therefore the light scattering layer may be between the base layer and the electrode layer. FIGS. 1 and 2 show schematics of illustrative embodiments of the substrate in which the light scattering layer (103) and the electrode layer (102) are on the base layer (101) in this order. The electrode layer may be formed so that its formation area may be broader than a formation area of the light scattering layer. The term "formation area" as used herein may refer to an area of the light scattering layer or of the electrode layer recognized when the substrate is observed from above. The light scattering layer may be various forms, as long as the light scattering layer is formed so that the formation area of the electrode layer may be broader than the formation area of the light scattering layer. In one embodiment, the light scattering layer (103) may be formed only on the region excluding peripheries of the base layer (101) as shown in FIG. 1, or may partially remain on the peripheries of the substrate (101) as shown in FIG. 2.

FIG. 3 shows a schematic of an illustrative embodiment of the substrate in FIG. 1 observed from above. As shown in FIG. 3, the formation area (A) of the electrode layer is broader than the formation area (B) of the light scattering layer, as recognized when the substrate is observed from above. A ratio (A/B) of the formation area (A) of the electrode layer and the formation area (B) of the light scattering layer may be, for example, about 1.04 or more, about 1.06 or more, about 1.08 or more, about 1.1 or more, or about 1.15 or more. Further, an upper limit of the ratio (A/B) is not particularly limited and may be, for example, about 2.0 or less, about 1.5 or less, about 1.4 or less, about 1.3 or less, or about 1.25 or less. In the substrate, the electrode layer may also be formed also on the surface of the base layer on which the light scattering layer is not formed. By the above, the structure in which the light scattering layer is not exposed to the external environment when the organic electronic device is fabricated.

In one embodiment, as shown in FIG. 3, the electrode layer may be formed up to a region including a region beyond the entire peripheries of the light scattering layer when observed from above. In this embodiment, as shown in FIG. 2, in case where there are a plurality of light scattering layers on the base layer, the electrode layer may be formed up to a region including a region beyond the entire peripheries of at least one of the light scattering layers, for example, at least a light scattering layer on which the organic layer is due to be formed, as will be described below. In one embodiment, if the organic layers are also due to be formed on the light scattering layers which are on the right and left periphery sides in the structure of FIG. 2, the structure of FIG. 2 may be changed so that the electrode layer is formed up to the regions beyond the entire peripheries of the light scattering layers on the right and left periphery sides by extending to the right and left sides. In the above structure, the structure in which the light scattering layer is encapsulated may be formed by attaching an encapsulation structure, which will be described below, to the electrode layer under which the light scattering layer is not formed.

As for the base layer, appropriate materials may be used without particular limitations. In one embodiment, when applied to the bottom emitting device, a transparent base layer, for instance, the base layer having a light transmittance with respect to visible lights of 50% or more, may be used. Examples of the transparent base layer may include a glass base layer or a transparent polymer base layer. Examples of the glass base layer may include a base layer of soda-lime glass, a glass containing barium/strontium, lead glass, aluminosilicate glass, borosilicate glass, barium borosilicate glass or quartz, and examples of the polymer base layer may include a base layer including polycarbonate (PC), an acrylic resin, poly(ethylene terephthalate) (PET), poly(ether sulfide) (PES) or polysulfone (PS), but is not limited thereto. If necessary, the base layer may be a TFT substrate having a driving TFT.

If the substrate is applied to the top emitting device, the base layer need not necessarily be the transparent base layer. If necessary, a reflection layer formed of, for example, aluminum may be formed on the surface of the base layer.

The electrode layer may be a conventionally used electrode layer capable of injecting a hole or an electron injection in fabrication of an organic electronic device.

The hole injecting electrode layer may be formed, for example, using a material having a relatively high work function, and, if necessary, formed using the transparent material. In one embodiment, the hole injecting electrode layer may include a metal, an alloy, a electro-conductive compound having the work function of at least about 4.0 eV, or a mixture of at least two thereof. Examples of such materials may include a metal such as gold, CuI, oxide materials such as indium tin oxide (ITO), indium zinc oxide (IZO), zinc tin oxide (ZTO), zinc oxide doped with aluminum or indium, magnesium indium oxide, nickel tungsten oxide, ZnO, $SnO_2$ or $In_2O_3$, metal nitrides such as gallium nitride, metal selenides such as zinc selenide, and metal sulfides such as zinc sulfide. In addition, the transparent hole injecting electrode layer may be formed with a stack of a metal thin layer such as Au, Ag or Cu, and a highly reflective transparent material such as ZnS, $TiO_2$ or ITO.

The hole injecting electrode layer may be formed by any methods, such as deposition, sputtering, chemical deposition or electrochemical means. In addition, the formed electrode layer may be patterned through the process using known techniques such as photolithography or shadow mask if necessary.

The transparent electron injecting electrode layer may be formed with, for example, a transparent material having a relatively small work function, and for instance, the appropriate materials above used for formation of the hole injecting electrode layer may be used, but is not limited thereto. The electron injecting electrode layer also may be formed by, for example, a deposition or sputtering method, and may be appropriately patterned if necessary.

The "light scattering layer" used herein may refer to a layer formed to be capable of scattering, refracting or diffracting light incident to the layers, and its embodiments are not particularly limited as long as the light scattering layer may exhibit function as described above.

In one embodiment, the light scattering layer may be a layer including a matrix material and a scattering region. FIG. 4 shows a schematic of an illustrative embodiment of the light scattering layer in which the scattering region (1031) formed with scattering particles and the matrix material (1032) is included and which is formed on the base layer (101). The term "scattering region" as used herein may refer to, for example, a region that has a different refractive index from surrounding materials, such as the matrix material or a planarization layer, which will be described below, and has an appropriate size, and therefore may scatter, refract or diffract an incident light. The scattering region may be, for example, particles having such a refractive index and size, or a vacant space. In one embodiment, the scattering region may be formed with particles which has a different refractive indexes from that of the surrounding material and which has higher or lower refractive indexes than the surrounding materials. A difference of the refractive index between the scattering particle and the surrounding materials, for example, the matrix material and/or the planarization layer, may be greater than 0.3 or 0.3 or more. In one embodiment, the scattering particles may have a refractive index of approximately 1.0 to 3.5 or 1.0 to 3.0. The term "refractive index" as used herein may refer to a refractive index measured with respect to lights having wavelengths of about 550 nm. The refractive index of the scattering particles may be, for example, in the range from 1.0 to 1.6 or from 1.0 to 1.3. In another embodiment, the refractive index of the scattering particles may be in the range from approximately 2.0 to 3.5 or from approximately 2.2 to 3.0. Examples of the scattering particles may include the particles having a mean particle size of at least 50 nm, at least 100 nm, at least 500 nm or at least 1,000 nm. The mean particle size of the scatting particles may be, for example, 10,000 nm or less. The scattering region may also be formed with a space which is filled with air as a vacant space having the same size above.

The scattering particles or region may have a globular shape, an ellipse shape, or a polyhedron, or may be amorphous, but the shapes of the scattering particles are not particularly limited. Examples of the scattering particles may include, for example, particles including organic materials such as polystyrene or a derivative thereof, an acrylic resin or a derivative thereof, a silicon resin or a derivative thereof, a novolac resin or a derivative thereof, or inorganic materials such as silica, alumina, titanium oxide or zirconium oxide. The scattering particles may be formed to include any one of or at least two of the above-identified materials. In one embodiment, hollow particles, such as hollow silica, or particles having a core/shell structure may be used as the scattering particles.

The light scattering layer may further include a matrix material to maintain the scattering region, such as the scattering particles. The matrix material may be formed, for example, with a material having a refractive index similar to or higher than those of other neighboring materials, such as the base layer. In one embodiment, a polyimide, a cardo resin having a fluorene ring, urethane, epoxide, a polyester or acrylate based thermo-curable or photo-curable monomeric, oligomeric or polymeric organic materials, inorganic materials such as silicon oxide, silicon nitride, silicon oxynitride or polysiloxane, or organic-inorganic hybrid materials may be used as the matrix material.

The matrix material may include polysiloxane, poly(amic acid) or polyimide. Among the above, polysiloxane may be formed, for example, by poly-condensation of condensable silane compounds or a siloxane oligomers to form a matrix material based on silicon-oxygen bonds (Si—O). By regulating the condensation conditions during formation of the matrix material, the polysiloxane may be formed to be exclusively based on siloxane bonds (Si—O), or may include partially remained organic groups such as an alkyl group, or condensable functional groups such as an alkoxy group.

In one embodiment, the poly(amic acid) or polyimide having a refractive index with respect to light having wavelength of 633 nm of about 1.5 or more, about 1.6 or more, about 1.65 or more or about 1.7 or more may be used. Such poly(amic acid) or polyimide having such high refractivity may be, for example, prepared using the monomer in which halogen atoms other than fluorine, sulfur atoms or phosphorus atoms are introduced. In one embodiment, the poly(amic acid) which may enhance dispersion stability of particles due to the presence of sites which may attach to the particles, such as carboxylic acid, may be used. For the poly(amic acid), the compound including a repeating unit having the following Formula 1 may be used.

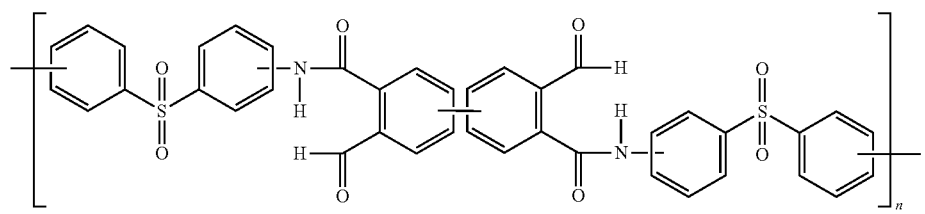

Formula 1

In the Formula 1, n is a positive number.

The repeating unit may be optionally substituted with at least one substituent. Examples of the substituent may include a halogen atom other than fluorine, a phenyl group, a benzyl group, a naphthyl group, or a functional group containing a halogen atom, a sulfur atom or a phosphorus atom, such as a thiophenyl group.

The poly(amic acid) may be a homopolymer formed by the repeating unit of Formula 1, or a block or random copolymer including another unit other than the repeating unit of Formula 1. In case of the copolymer, for example, the type or ratio of the other unit may be appropriately selected as long as it does not inhibit a target refractive index, thermal resistance, or transmittance.

The repeating unit of Formula 2 below may be an illustrative embodiment of the repeating unit of Formula 1.

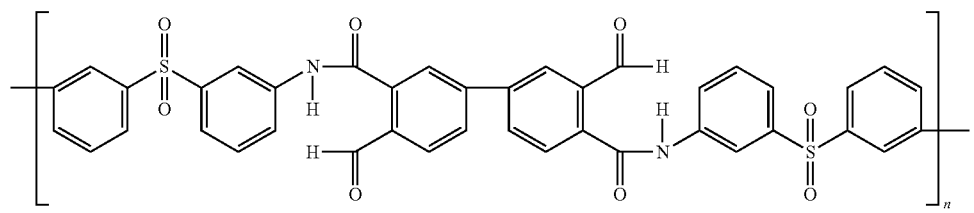

Formula 2

In Formula 2, n is a positive number.

In one embodiment, the poly(amic acid) may have a weight-average molecular weight of approximately 10,000 to 100,000 or approximately 10,000 to 50,000 as measured for the standard polystyrene using gel permeation chromatography (GPC). The poly(amic acid) having the repeating unit of Formula 1 also has a light transmittance of at least 80%, at least 85% or at least 90% in visible light regions, and has superior thermal resistance.

The light scattering layer may be, for example, a layer having a concavo-convex structure. FIG. 5 shows a schematic of an illustrative embodiment of the light scattering layer (103) having the concavo-convex structure on the base layer (101). Incident lights may be scattered by appropriate control of the concavo-convex structure of the light scattering layer. The light scattering layer having the concavo-convex structure may be prepared, for example, by curing a thermo-curable or photo-curable material with contacting it with a mould which can transfer the target concavo-convex structure form during curing process, or by forming a layer of the material to form the light scattering layer and then forming the concavo-convex structure by an etching process, and the like. As an alternative, the light scattering layer may be formed by combining particles having an appropriate size and shape in a binder which forms the light scattering layer. In this case, the particles are not necessarily particles having a scattering function, although the particles having the scattering function may be used without limitation.

The light scattering layer may be formed, for example, by coating a material by a wet coating method, curing the material by applying heat, irradiating light or using a sol-gel method, or by a deposition method such as chemical vapor deposition (CVD) or physical vapor deposition (PVD), or by nano-imprinting or micro-embossing.

The light scattering layer may further include a high refractive particle, if necessary. The term "high refractive particle" as used herein may refer to, for example, a particle having a refractive index of at least 1.5, at least 2.0, at least 2.5, at least 2.6 or at least 2.7. The upper limit of the refractive index of the high refractive particle may be selected, for example, within the suitable range to satisfy a target refractive index of the light scattering layer. The high refractive particle may have, for example, a smaller mean particle size than the scattering particle. The high refractive particle may have, for example, a mean particle size of approximately 1 nm to 100 nm, 10 nm to 90 nm, 10 nm to 80 nm, 10 nm to 70 nm, 10 nm to 60 nm, 10 nm to 50 nm, or 10 nm to 45 nm. Examples of the high refractive particle may include alumina, aluminosilicate, titanium oxide or zirconium oxide. In one embodiment, rutile titanium oxide may be used as the high refractive particle having the refractive index of at least 2.5. The rutile titanium oxide has a higher refractive index than other particles, and as such, the control for the target refractive index may be attained with a relatively small ratio.

The substrate may further include a planarization layer on an upper part of the light scattering layer. The planarization layer may be formed with the formation area corresponding to the light scattering layer. The term "B having the formation area corresponding to A" as used herein may refer to the case where the formation area of the "A" and the formation area of the "B" are substantially the same based on the area recognized when the substrate is observed from above, unless defined otherwise. The term "substantially the same" above may include, for example, a case where the formation areas of the two regions has very small difference which is due to process errors, and the like. In one embodiment, the case in which a ratio (AA/BA) of the formation area (AA) of the "A" and the formation area (BA) of the "B" having the formation area corresponding to the "A" is in the range from 0.5 to 1.5, from 0.7 to 1.3, from 0.85 to 1.15 or substantially 1 may be included in the above case. When there is an additional planarization layer, the light scattering layer and the planarization layer may be between the base layer and the electrode layer, the formation area of the electrode layer may be broader than the formation area of the light scattering layer and the planarization layer, and the electrode layer may be formed on the surface of the base layer on which the light scattering layer and the planarization layer are not formed. Nevertheless, the planarization layer is not mandatory, and may be omitted, for example, if the light scattering layer itself is formed to be flat.

The planarization layer may provide, for example, a surface on which the electrode layer may be formed on the light scattering layer, and better light extraction efficiency through an interaction with the light scattering layer. The planarization layer may have, for example, a refractive index equivalent to that of the neighboring electrode layer. The refractive index of the planarization layer may be, for example, 1.7 or more, from 1.8 to 3.5 or from 2.2 to 3.0. When the planarization layer is formed on the light scattering layer having the above-described concavo-convex structure, the planarization layer may be formed to have a different refractive index from the light scattering layer.

The planarization layer may be formed, for example, by mixing the above-described high refractive particle with a matrix material. In one embodiment, the matrix materials described in the part for the light scattering layer may be used for such a matrix material.

In another embodiment, the planarization layer may be formed using a material in which a compound such as an alkoxide or acylate of a metal such as zirconium, titanium or cerium is combined with a binder having polar group, such as a carboxyl group or a hydroxyl group. The compound, such as an alkoxide or acylate, may react with the polar group in the binder through condensation, and the high refractive index may be attained by introducing the metal into a backbone of the binder. Examples of the alkoxide or acylate compound may include a titanium alkoxide such as tetra-n-butoxy titanium, tetraisopropoxy titanium, tetra-n-propoxy titanium or tetraethoxy titanium, a titanium acylate such as titanium stearate, a titanium chelate, a zirconium alkoxide such as tetra-n-butoxy zirconium, tetra-n-propoxy zirconium, tetraisopropoxy zirconium or tetraethoxy zirconium, a zirconium acylate such as zirconium tributoxystearate, and a zirconium chelate. The planarization layer may be formed by a sol-gel coating method in which a coating solution is prepared by combining a metal alkoxide such as a titanium alkoxide or a zirconium alkoxide with a solvent such as alcohol or water, and the coating solution is applied and sintered at an appropriate temperature.

The present application relates to an organic electronic device (OED). An illustrative organic electronic device may include a substrate which includes a base layer, a light scattering layer and an electrode layer. In one embodiment, the above described substrate having the above-described structure may be used as the substrate. In one embodiment, the organic electronic device may include a base layer; a light scattering layer formed on the base layer, a first electrode layer formed on the light scattering layer, an organic layer formed on the first electrode layer; and a second electrode layer formed on the organic layer. In the above, a formation area of the first electrode layer may be broader than a formation area of the light scattering layer, and the electrode layer may also be formed on the surface of the base layer on which the light scattering layer is not formed. In the above, the above-described explanation may be equally applied in connection with the base layer, the first electrode layer and the light scattering layer, and if necessary, the above-described planarization layer may be between the light scattering layer and the first electrode layer.

In one embodiment, the organic layer may include at least one light-emitting layer. In one embodiment, when the first electrode layer is transparent and the second electrode layer is a reflective electrode layer, the bottom emitting device in which photons produced in the light-emitting layer of the organic layer are emitted toward the base layer through the light scattering layer may be attained.

The light scattering layer in the organic electronic device may have, for example, a formation area corresponding to or larger than the light-emitting area of the light-emitting layer. In one embodiment, a difference (B-C) between a length (B) of the formation area of the light scattering layer and a length (C) of a light-emitting area of the light-emitting layer may be in the range from about 10 μm to about 2 mm. In the above, the length (B) of the formation area of the light scattering layer is the length of any direction in regions recognized when the light scattering layer is observed from above, and in this case, the length (C) of the light-emitting area may refer to the length measured in the same direction for the length (B) of the formation area of the light scattering layer based on the regions recognized when the light-emitting area is observed from above. The light scattering layer may be also formed in a position corresponding to the light-emitting area. The term "light scattering layer being formed in a position corresponding to the light-emitting area" as used herein may refer to, for example, the case where the light-emitting area and the light scattering layer substantially overlap when the organic electronic device is observed from above or below.

In one embodiment, the organic electronic device may be an organic light-emitting device (OLED). In the case of the organic light-emitting device, the organic electronic device may have, for example, a structure in which an organic layer including at least one light-emitting layer is sandwiched between a hole injecting electrode layer and an electron injecting electrode layer. In one embodiment, if the electrode layer in a substrate is the hole injecting electrode layer, the second electrode layer may be the electron injecting electrode layer, or if the electrode layer in a substrate is the electron injecting electrode layer, the second electrode layer may be the hole injecting electrode layer.

The organic layer between the electron and hole injecting electrode layers may include at least one light-emitting layer. The organic layer may include a plurality of, i.e., at least two, light-emitting layers. When at least two light-emitting layers are included, the light-emitting layers may have a structure in which they are split by an intermediate electrode layer having charge generating characteristics or a charge generating layer (CGL).

The light-emitting layer may be formed, for example, using various fluorescent or phosphorescent organic materials known in the field. Examples of materials for the light-emitting layer include Alq type materials such as tris(4-methyl-8-quinolinolate)aluminum(III) (Alq3), 4-MAlq3 or Gaq3, C-545T ($C_{26}H_{26}N_2O_2S$), DSA-amine, TBSA, BTP, PAP-NPA, spiro-FPA, $Ph_3Si(PhTDAOXD)$, cyclopentadiene derivatives, such as PPCP (1,2,3,4,5-pentaphenyl-1,3-cyclopentadiene), DPVBi (4,4'-bis(2,2'-diphenylvinyl)-1,1'-biphenyl), distyryl benzene or derivatives thereof or DCJTB (4-(Dicyanomethylene)-2-tert-butyl-6-(1,1,7,7,-tetramethyljulolidyl-9-enyl)-4H-pyran), DDP, AAAP, NPAMLI; or phosphorescent materials such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir(bpy)$, $F_2Ir(acac)$, $op_2Ir(acac)$, $ppy_2Ir(acac)$, $tpy_2Ir(acac)$, FIrppy (fac-tris[2-(4,5'-difluorophenyl)pyridine-C'2,N]iridium(III)) or $Btp_2Ir$ (acac) (bis(2-(2'-benzo[4,5-a]thienyl)pyridinato-N,C3') iridium(acetylacetonate)), but is not limited thereto. The light-emitting layer may have a host-dopant system which includes said material as a host, and perylene, distyrylbiphenyl, DPT, quinacridone, rubrene, BTX, ABTX, DCJTB and the like as a dopant.

The light-emitting layer may be formed using an appropriate type showing light-emitting characteristics among electron accepting organic compounds or electron donating organic compounds which will be described below.

The organic layer may be formed with various structures which further include other various functional layers known in the field, as long as it includes the light-emitting layer. Examples of the layer which may be included in the organic layer may include an electron injection layer, a hole blocking layer, an electron transport layer, a hole transport layer and a hole injection layer.

The electron injection layer or the electron transport layer may be formed, for example, using an electron accepting organic compound. Any known compound may be used as the electron accepting organic compound without particular limitation. Examples of such organic compound may include polycyclic compounds or derivatives thereof such as p-terphenyl or quaterphenyl, polycyclic hydrocarbon compounds or derivatives thereof such as naphthalene, tetracene, pyrene, coronene, chrysene, anthracene, diphenylanthracene, naphthacene or phenanthrene, and heterocyclic compounds or derivatives thereof such as phenanthroline, bathophenanthroline, phenanthridine, acridine, quinoline, quinoxaline or phenazine. In addition, fluoreceine, perylene, phthaloperylene, naphthaloperylene, perynone, phtahloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone or rubrene or derivatives thereof, metal chelate complex compounds disclosed in Japanese Patent Laid-open Publication No. 1988-295695, Japanese Patent Laid-open Publication No. 1996-22557, Japanese Patent Laid-open Publication No. 1996-81472, Japanese Patent Laid-open Publication No. 1993-009470 or Japanese Patent Laid-open Publication No. 1993-017764, for example, metal chelate oxanoid compound, such as tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolato lithium, tris(5-chloro-8-quinolinolato) gallium, or bis(5-chloro-8-quinolinolato)calcium, which are metal complexes having at least one ligand of 8-quinolinolato or a derivative thereof, oxadiazole compounds disclosed in Japanese Patent Laid-open Publication No. 1993-202011, Japanese Patent Laid-open Publication No. 1995-179394, Japanese Patent Laid-open Publication No. 1995-278124 or Japanese Patent Laid-open Publication No. 1995-228579, triazine compounds disclosed in Japanese Patent Laid-open Publication No. 1995-157473, stilbene derivatives or distyrylarylene derivatives disclosed in Japanese Patent Laid-open Publication No. 1994-203963, styryl derivatives disclosed in Japanese Patent Laid-open Publication No. 1994-132080 or Japanese Patent Laid-open Publication No. 1994-88072, diolefin derivatives disclosed in Japanese Patent Laid-open Publication No. 1994-100857 or Japanese Patent Laid-open Publication No. 1994-207170; fluorescent brightening agents, such as a benzooxazole compound, a benzothiazole compound or a benzoimidazole compound; distyrylbenzene compounds such as 1,4-bis(2-methylstyryl) benzene, 1,4-bis(3-methylstyryl)benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methyl benzene or 1,4-bis(2-methylstyryl)-2-ethyl benzene; distyrylpyrazine compounds such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine or 2,5-bis[2-(1-pyrenyl)vinyl]pyrazine, dimethylidine compounds or derivatives thereof such as 1,4-phenylenedimethylidine, 4,4'-phenylenedimethylidine, 2,5-xylenedimethylidine, 2,6-naphthylenedimethylidine, 1,4-biphenylenedimethylidine, 1,4-para-terephenylenedimethylidine, 9,10-anthracenediylmethylidine, 4,4'-(2,2-di-t-butylphenylvinyl) biphenyl, 4,4'-(2,2-diphenylvinyl)biphenyl, silanamine derivatives disclosed in Japanese Patent Laid-open Publication No. 1994-49079 or Japanese Patent Laid-open Publication No. 1994-293778, polyfunctional styryl compounds disclosed in Japanese Patent Laid-open Publication No. 1994-279322 or Japanese Patent Laid-open Publication No. 1994-279323, oxadiazole derivatives disclosed in Japanese Patent Laid-open Publication No. 1994-107648 or Japanese Patent Laid-open Publication No. 1994-092947, anthracene compounds disclosed in Japanese Patent Laid-open Publication No. 1994-206865, oxynate derivatives disclosed in Japanese Patent Laid-open Publication No. 1994-145146, tetraphenylbutadiene compounds disclosed in Japanese Patent Laid-open Publication No. 1992-96990, organic trifunctional compounds disclosed in Japanese Patent Laid-open Publication No. 1991-296595, coumarin derivatives disclosed in Japanese Patent Laid-open Publication No. 1990-191694, perylene derivatives disclosed in Japanese Patent Laid-open Publication No. 1990-196885, naphthalene derivatives disclosed in Japanese Patent Laid-open Publication No. 1990-255789, phthaloperynone derivatives disclosed in Japanese Patent Laid-open Publication No. 1990-289676 or Japanese Patent Laid-open Publication No. 1990-88689, or styrylamine derivatives disclosed in Japanese Patent Laid-open Publication No. 1990-250292 may be used as the electron accepting organic compound included in a low refractive layer. Further, in the above, the electron injection layer may be formed, for example, using LiF or CsF.

The hole blocking layer is a layer which blocks holes injected from a hole injecting electrode layer from passing through a light-emitting layer to enter an electron injection electron layer, thus enhancing lifespan and efficiency of a device, and may be formed in an appropriate part between the light-emitting layer and the electron injecting electrode layer using known materials, if necessary.

The hole injection layer or the hole transport layer may include, for example, an electron donating organic compound. Representative examples of the electron donating organic compound include aryl amine compounds such as N,N',N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostilbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamino)-4'-[4-(di-p-tolylamino)styryl]stilbene, N,N,N',N'-tetraphenyl-4,4'-diaminobiphenyl N-phenylcarbazole, 4,4'-bis[N-(1-naphthyl)-N-phenylamino]biphenyl, 4,4''-bis[N-(1-naphthyl)-N-phenylamino]p-terphenyl, 4,4'-bis[N-(2-naphthyl)-N-phenylamino]biphenyl, 4,4'-bis[N-(3-acenaphtenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4''-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino] naphthalene, 2,6-bis[N-(1-naphthyl)-N-(2-naphthyeamino] naphthalene, 4,4''-bis[N,N-di(2-naphthyl)amino]terphenyl, 4,4'-bis{N-phenyl-N-[4-(1-naphthyl)phenyl] amino}biphenyl, 4,4'-bis[N-phenyl-N-(2-pyrenyl)amino]biphenyl, 2,6-bis[N,N-di-(2-naphthyeamino]fluorene, 4,4''-bis(N,N-di-p-tolylamino)terphenyl, and bis(N-1-naphthyl)(N-2-naphthyl)amine, but the present application is not limited thereto.

The hole injection layer or the hole transport layer may be formed by dispersing an organic material in a polymer, or using the polymer derived from the organic material. In addition, so called π-conjugated polymers, such as polyparaphenylenevinylene and derivatives thereof, a hole transport non-conjugated polymer such as poly(N-vinylcarbazole), or σ-conjugated polymer of polysilane may be used.

The hole transport layer may be formed using a metal phthalocyanine such as copper phthalocyanine, a non-metal phthalocyanine, a carbon film or an electrically conductive polymer such as polyaniline, or by reacting the aryl amine compound as an oxidizing agent with a Lewis acid.

According to one illustrative embodiment, the organic light-emitting device may have a structure having layers in the following orders: (1) hole injecting electrode layer/ organic light-emitting layer/electron injecting electrode layer; (2) hole injecting electrode layer/hole injection layer/ organic light-emitting layer/electron injecting electrode layer; (3) hole injecting electrode layer/organic light-emitting layer/electron injection layer/electron injecting electrode layer; (4) hole injecting electrode layer/hole injection layer/organic light-emitting layer/electron injection layer/ electron injecting electrode layer; (5) hole injecting electrode layer/organic semiconductor layer/organic light-emitting layer/electron injecting electrode layer; (6) hole injecting electrode layer/organic semiconductor layer/electron barrier layer/organic light-emitting layer/electron injecting electrode layer; (7) hole injecting electrode layer/ organic semiconductor layer/organic light-emitting layer/ adhesion improving layer/electron injecting electrode layer; (8) hole injecting electrode layer/hole injection layer/hole transport layer/organic light-emitting layer/electron injection layer/electron injecting electrode layer; (9) hole injecting electrode layer/insulation layer/organic light-emitting layer/insulation layer/electron injecting electrode layer; (10) hole injecting electrode layer/inorganic semiconductor layer/insulation layer/organic light-emitting layer/insulation layer/electron injecting electrode layer; (11) hole injecting electrode layer/organic semiconductor layer/insulation layer/organic light-emitting layer/insulation layer/electron injecting electrode layer; (12) hole injecting electrode layer/ insulation layer/hole injection layer/hole transport layer/ organic light-emitting layer/insulation layer/electron injecting electrode layer and (13) hole injecting electrode layer/ insulation layer/hole injection layer/hole transport layer/ organic light-emitting layer/electron injection layer/electron injecting electrode layer, and the structure including the organic layer in which at least two light-emitting layers between the hole injecting electrode layer and the electron injecting electrode layer are split by an intermediate electrode layer having charge generating characteristics or a charge generating layer (CGL), but the present application is not limited thereto.

The various materials used to form the hole or electron injecting electrode layer and the organic layers, such as the light-emitting layer, the electron injection or transport layer, the hole injection or transport layer, and the methods for forming the same are known in the field, and as such, the organic electronic device may be manufactured in the same manner as described above.

The organic electronic device may further include an encapsulation structure. The encapsulation structure may be a protection structure which prevents introduction of foreign substances, such as moisture or oxygen, into the organic layer of the organic electronic device. The encapsulation structure may be, for example, a can, such as a glass can or a metal can, or a film covering an entire surface of the organic layer.

FIG. 6 shows a schematic of an illustrative embodiment in which an organic layer (401) formed on the substrate including a base layer (101), a light scattering layer (103) and a first electrode layer (102) in this order, and a second electrode layer (402) are protected by an encapsulation structure (403) having a can structure, such as a glass can or a metal can. As shown in FIG. 6, the encapsulation structure (403) may be attached, for example, to the substrate by an adhesive (404). The encapsulation structure may be attached, for example, to the electrode layer under which the light scattering layer is not formed in the substrate. In one embodiment, as shown in FIG. 6, the encapsulation structure (403) may be attached to an end part of the substrate by an adhesive (404). In this manner, a protection effect by the encapsulation structure may be maximized.

The encapsulation structure may be, for example, a film covering the entire side of the organic layer and/or the second electrode layer. FIG. 7 shows a schematic of an illustrative embodiment of the encapsulation structure (501)

in the form of film covering the entire side of the organic layer (401) and the second electrode layer (402). In one embodiment, as shown in FIG. 7, the encapsulation structure (501) in the form of film may cover the entire surface of the organic layer (401) and the second electrode layer (402), and may attach the substrate including the base layer (101), the light scattering layer (103) and the electrode layer (102) to a second substrate (502) which is in the upper side of the substrate. In the above, examples of the second substrate may include, for example, a glass substrate, a metal substrate, a polymer film or a barrier layer. The encapsulation structure in the form of film may be formed, for example, by applying and curing a liquid-phase material which is cured by heat or irradiation of ultraviolet (UV) light, such as an epoxy resin, or by laminating the substrate and the upper substrate using an adhesive sheet, and the like which is prepared in the form of film using the epoxy resin and the like.

The encapsulation structure may include a moisture adsorbent or a gettering agent such as metal oxides such as calcium oxide or beryllium oxide, metal halides such as calcium chloride, or phosphorus pentoxide, if necessary. The moisture adsorbent or the gettering agent may be, for example, contained inside the encapsulation structure in the form of film, or in a certain position in the encapsulation structure having a can structure. Further, the encapsulation structure may further include a barrier film or a conductive film.

As shown in FIG. 6 or FIG. 7, the encapsulation structure may be attached, for example, to an upper part of the first electrode layer, beneath which the light scattering layer or the light scattering layer and the planarization layer are not formed. Accordingly, the enclosed structure in which the light scattering layer or the light scattering layer and the planarization layer are not exposed to the external environment may be attained. The enclosed structure may refer to, for example, a state in which the entire side of the light scattering layer or the light scattering layer and the planarization layer are surrounded by the base layer, the electrode layer and/or the encapsulation structure or by an enclosed structure formed to include the base layer, the electrode layer and/or the encapsulation structure, thereby are not exposed to the external environment. The enclosed structure may be formed only with the base layer, the electrode layer and/or the encapsulation structure, or may include other elements along with the base layer, the electrode layer and the encapsulation structure, as long as it is formed so that the light scattering layer or the light scattering layer and the planarization layer are not exposed to the external environment. In one embodiment, in FIG. 6 or FIG. 7, other elements may be in the part in which the base layer (101) and the electrode (102) are in contact or in the part in which the first electrode layer (102) and the encapsulation structure (403, 501) are in contact, or in other positions. Examples of the other elements may include low vapor-permeable organic materials, inorganic materials or organic-inorganic hybrid materials, or an insulation layer or an auxiliary electrode.

The present application relates to a method of preparing a substrate for an organic electronic device or for preparing an organic electronic device. The illustrative method may include eliminating at least a part of the light scattering layer or the light scattering layer and the planarization layer on a base layer by processing the light scattering layer or the light scattering layer and the planarization layer. The light scattering layer or the light scattering layer and the planarization layer formed on the substrate may be, for example, patterned to be only in the position corresponding to the light-emitting area, as described above through the processing.

In one embodiment, as shown in FIG. 8, after forming the light scattering layer (103) on an entire side of the base layer (101), at least a part of the formed light scattering layer (103) may be removed. In addition, when the planarization layer is formed along with the light scattering layer, the planarization layer may be removed along with the light scattering layer. The method of forming the light scattering layer and/or the planarization layer on the base layer is not particularly limited, and any conventional method may be applied according to each embodiment of the light scattering layer and/or the planarization layer. In one embodiment, the light scattering layer and/or the planarization layer may be formed through the above-described coating methods, deposition methods such as chemical vapor deposition (CVD) or physical vapor deposition (PVD), or nano-imprinting or micro-embossing methods.

The method of removing at least a part of the light scattering layer or the light scattering layer and the planarization layer formed on the base layer is not particularly limited, and an appropriate method may be applied in consideration of the types of the formed light scattering layer or the formed light scattering layer and planarization layer.

In one embodiment, the layer may be removed by applying wet or dry etching in which the light scattering layer and/or the planarization layer are treated with an etching solution which can dissolve such a layer.

In another embodiment, the light scattering layer and/or the planarization layer may be removed through laser processing. In one embodiment, the removal may be performed by irradiating a laser after forming the light scattering layer and/or the planarization layer on the base layer. The laser may be irradiated, for example, from the side at which the light scattering layer and/or the planarization layer are formed, or from a side of the base layer if the base layer is transparent.

Any types of lasers may be used as long as they may have an appropriate output to remove the light scattering layer and/or the planarization layer.

In one embodiment, a fiber diode laser, or ruby ($Cr^{3+}$:$Al_2O_3$), YAG ($Nd^{3+}$:$Y_3Al_5O_{12}$), phosphate glass, silicate glass or YLF ($Nd^{3+}$:$LiYF_4$) lasers may be used as the laser. Such a laser may be, for example, irradiated in the form of a spot laser or a line beam laser. The irradiation conditions of the laser are not particularly limited as long as they are controlled to attain appropriate processing. In one embodiment, the laser having an ultraviolet (UV) to infrared (IR) wavelength may be irradiated with an output of about 1 W to about 10 W, but is not limited thereto.

The light scattering layer and/or the planarization layer may also be removed by a water jetting method. The water jetting method is a method of removing an object by spraying water at a certain pressure. In one embodiment, the light scattering layer and/or the planarization layer may be removed by spraying water at pressure of about 500 atm to 2000 atm or about 800 atm to 1300 atm. An abrasive agent may be further included in the pressurized water to be sprayed for the effective removal. As the abrasive agent, an appropriate material among known materials may be used in an appropriate ratio in consideration of the object to be removed.

When applying the water jetting method, a spraying radius or speed is not particularly limited and may be selected in consideration of a part to be removed or a removed pattern. In one embodiment, a spraying width may be controlled to be about 1 mm to about 10 mm or about 2 mm to about 5 mm during the water jetting process. In this way, precise removal of the light scattering layer and/or the planarization layer may be attained. Further, an spraying (etching) rate through water jetting may be, for example, about 300 mm/min to about 2000 mm/min or about 500 mm/min to about 1200 mm/min, thereby securing appropriate process efficiency and enabling effective removal.

A processed form of the light scattering layer and/or the planarization layer is not particularly limited, and may be varied depending on a purpose. In one embodiment, the processing may be performed such that at least part of the light scattering layer is removed, thereby causing the position of the remaining light scattering layer and/or planarization layer to correspond to a light-emitting area of the light-emitting layer, and its formation area to correspond to or be larger than the light-emitting layer or the light-emitting area formed by the light-emitting layer. In addition, the light scattering layer may be processed in various patterns, if necessary. Further, the light scattering layer or a stacked structure of the light scattering layer and the planarization layer in the position corresponding to the region at which an adhesive is applied for attachment to the encapsulation structure or corresponding to a connector part of the device may be removed.

The method may further include forming an electrode layer after removing the light scattering layer or the stacked structure of the light scattering layer and the planarization layer. In this embodiment, the electrode layer may be formed so as to form an enclosed structure which can enclose the light scattering layer and/or the planarization layer processed with the base layer. A method of forming the electrode layer is not particularly limited, and any method, such as known deposition, sputtering, chemical deposition or electrochemical methods, may be used.

The method of preparing an organic electronic device may include forming the organic layer including a light-emitting layer and the second electrode layer after forming the electrode layer as above, and further forming an encapsulation structure. In this instance, the organic layer, the second electrode layer and the encapsulation structure may be formed by the known method.

The present application relates to use of the above-described organic electronic device, such as an organic light-emitting device. The organic light-emitting device may be effectively applied to, for example, a backlight of liquid crystal display (LCD), a lighting apparatus, various sensors, a light source for printers or copy machines, a light source for vehicle gauges, a signal light, a pilot lamp, a display device, a light source for an area light-emitting device, a display, a decoration or various lights. In one particular example, the present application relates to a lighting apparatus including the organic light-emitting device. When the organic light-emitting device is applied to the lighting apparatus or other applications, a method of fabricating the device or parts of the device is not particularly limited, and any materials and methods known in the field may be adopted as long as the organic light-emitting device is used.

EFFECT

The substrate for an organic electronic device of the present application may, for example, be used to fabricate an organic electronic device, to which foreign substances such as moisture and oxygen are not permeated, and which has enhanced durability and superior light extraction efficiency. If the organic electronic device includes an encapsulation structure, the substrate may be stably attached to the encapsulation structure, and a surface hardness of outside connector part of the organic electronic device may be maintained to an appropriate level.

Hereinafter, illustrative embodiments of the present application will be described in detail by referring to Examples according to the present application and Comparative Examples which is not according to the present application. However, the scope of the present application is not limited to the Examples disclosed below.

EXAMPLES

Example 1

Figure 1:
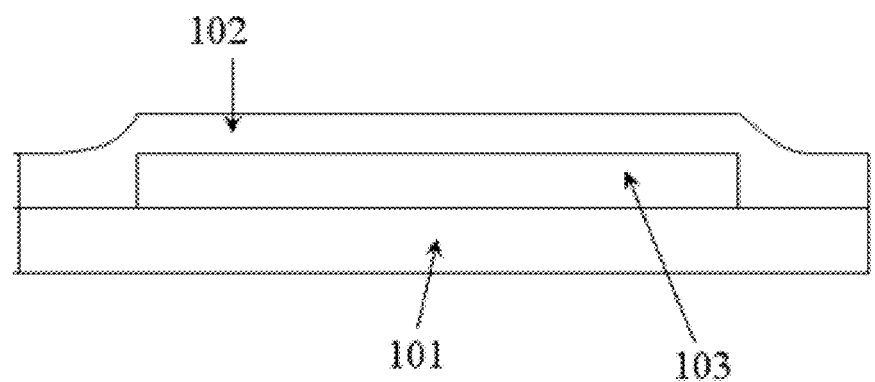
FIGS. 1 to 3 show schematics of illustrative embodiments of the substrates.
Figure 2:
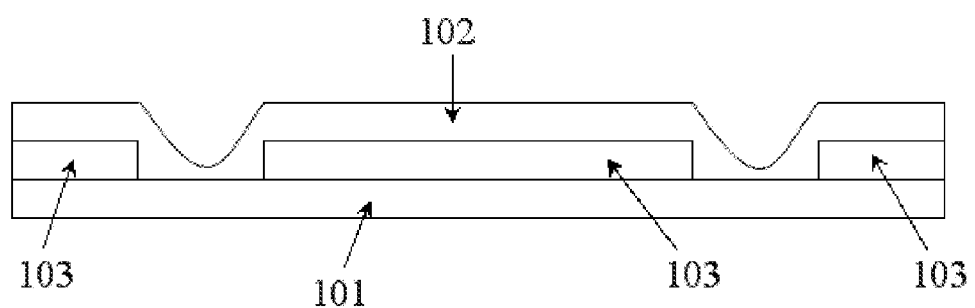
Figure 3:
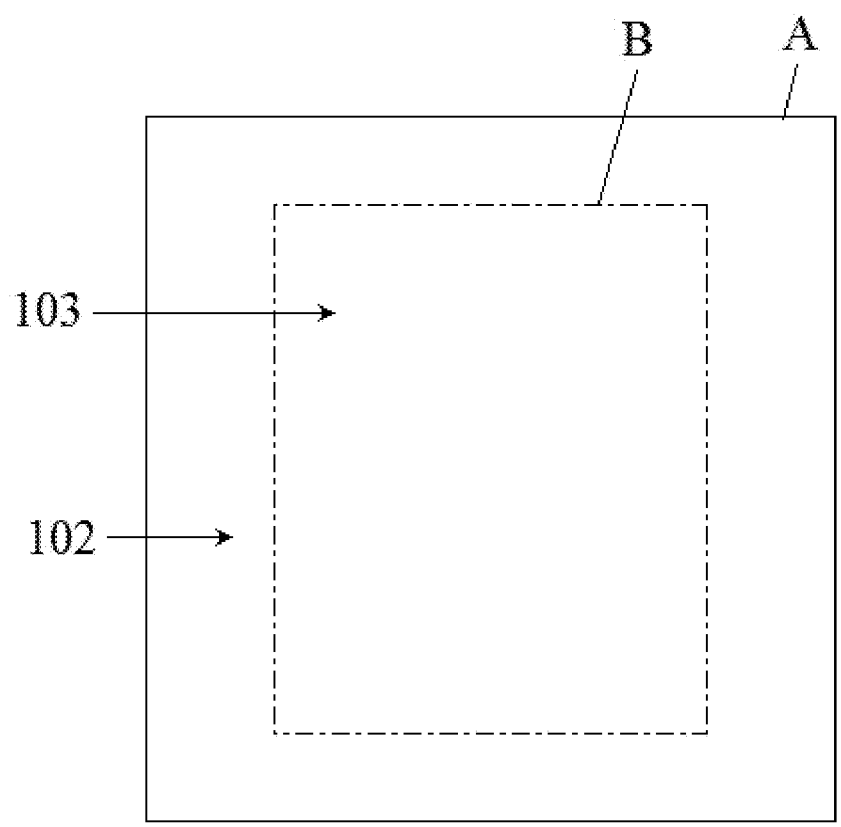
Figure 4:
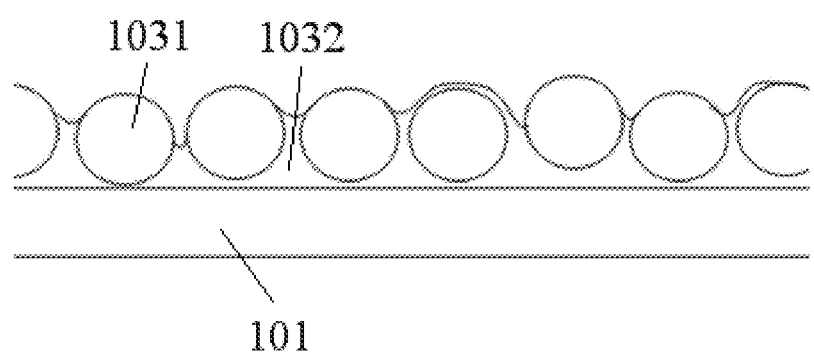
FIGS. 4 and 5 show schematics of illustrative embodiments of the light scattering layers.
Figure 5:
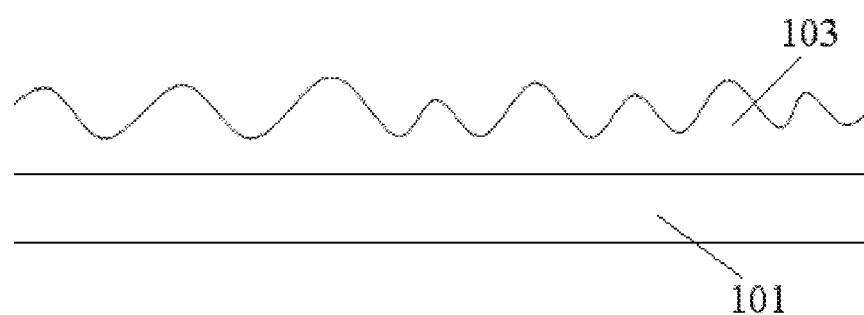
Figure 6:
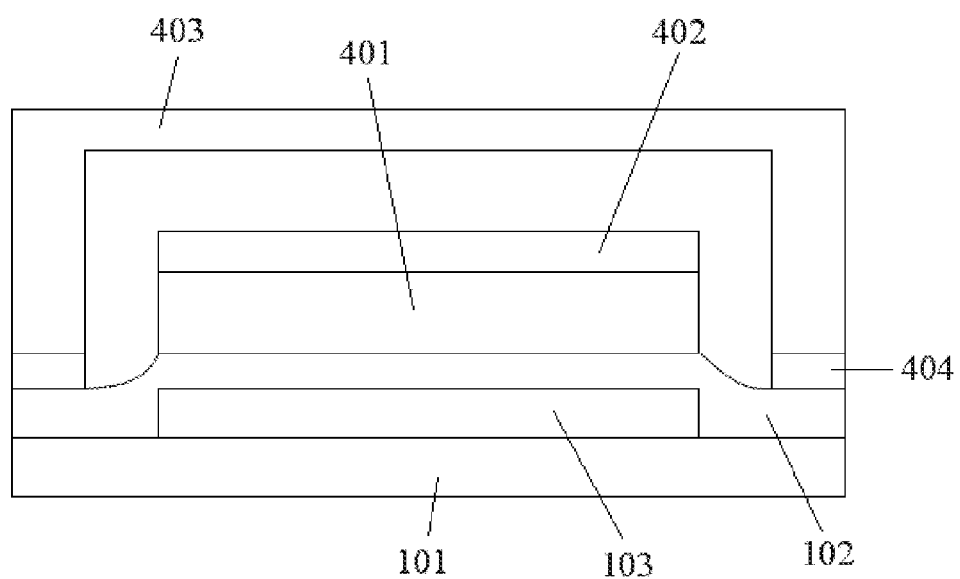
FIGS. 6 and 7 show schematics of illustrative embodiments of the organic electronic devices.
Figure 7:
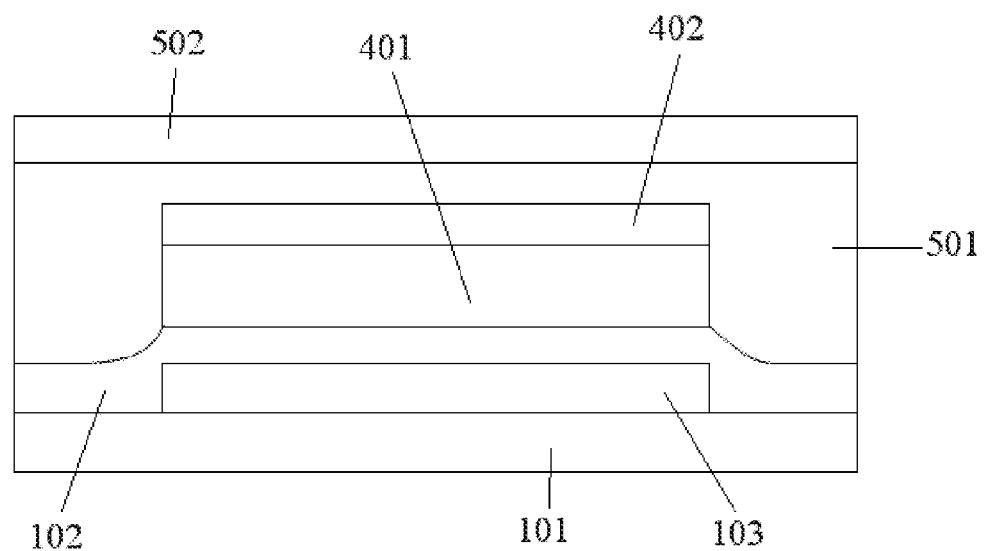
Figure 8:
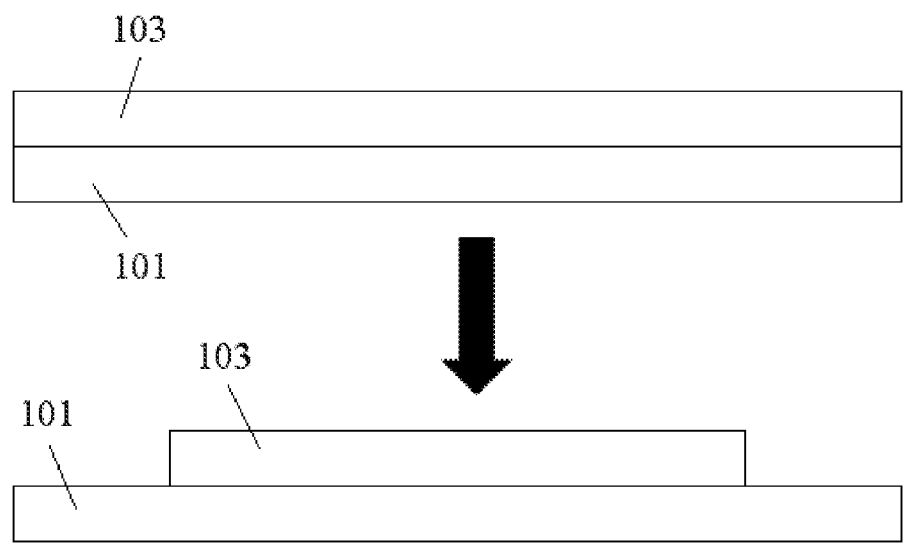
FIG. 8 shows a schematic of an illustrative embodiment of the process for preparing the substrate.

A coating solution for forming a light scattering layer was prepared by mixing scattering particles (titanium oxide particles) having a mean particle size of approximately 200 nm with a sol-gel coating solution including tetramethoxy silanes as condensable silanes and sufficiently dispersing them. The prepared coating solution was coated on the entire surface of a glass base layer. Then, a part of the light scattering layer was removed using fabric soaked with acetone so that the position of the remained light scattering layer might correspond to a light-emitting area in consideration of the position of a light-emitting layer of an organic layer to be formed later, and then the light scattering layer was formed by a sol-gel reaction. Thereafter, a high refractive coating solution, which was prepared by mixing high refractive titanium oxide particles having a refractive index of about 2.5 and a mean particle size of about 10 nm with the same sol-gel coating solution including tetramethoxy silanes, was coated on the light scattering layer, and a part thereof was removed by using fabric soaked with acetone so that the position of the remained layer might correspond to the light-emitting area and that the formation area might correspond to the formation area of the light scattering layer in consideration of the position of the light-emitting layer of the organic layer to be formed later. Subsequently, the sol-gel reaction of the layer was performed so as to form a planarization layer having a refractive index of about 1.8. After removal, a hole injecting electrode layer including indium tin oxide (ITO) was formed on the entire surface of the glass base layer by a conventional sputtering method, and then a hole injection layer, a hole transport layer, a light-emitting layer, an electron transport layer, an electron injection layer and an electron injecting electrode layer were formed using conventional materials and methods. Thereafter, the organic light-emitting device having an encapsulation structure as shown in FIG. 6 was prepared using a glass can.

Example 2

Figure 9:
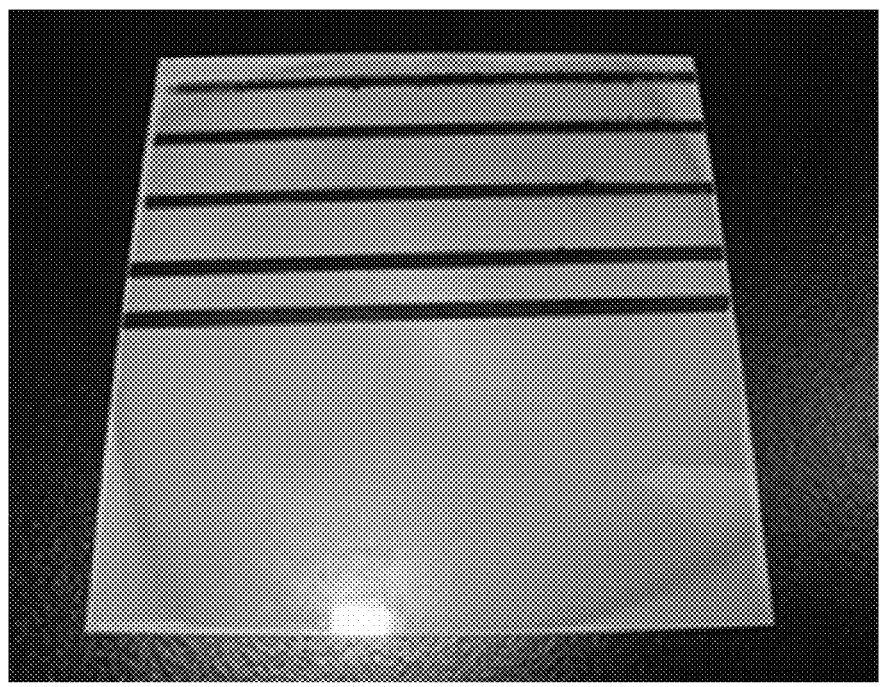
FIGS. 9 and 10 are images showing states where the light scattering layer and the planarization layer were removed in Example 2.
Figure 10:
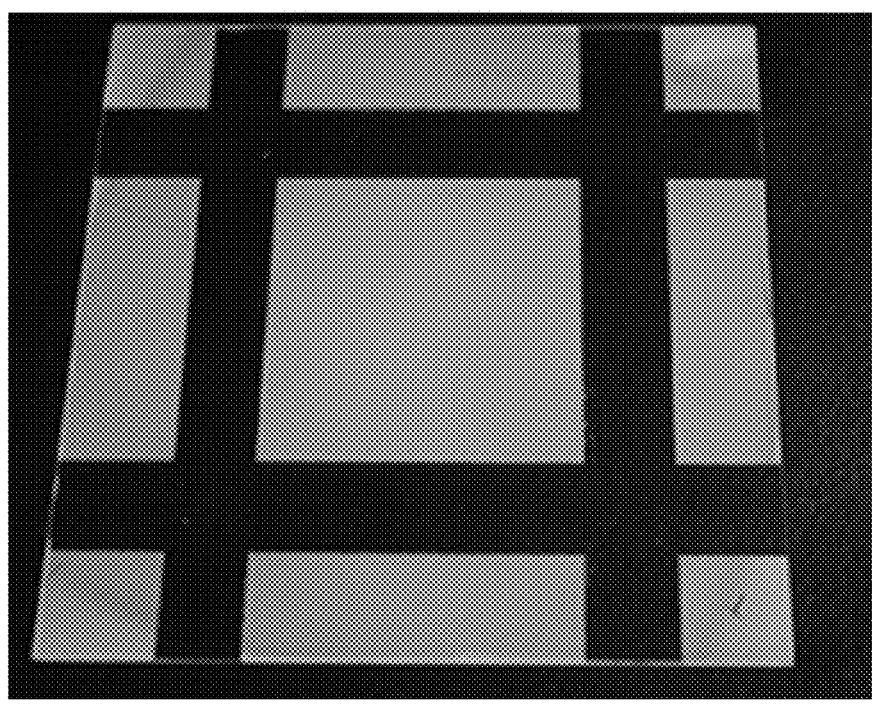

The organic light-emitting device was prepared in the same manner as in Example 1, except that the removal of the light scattering layer and the planarization layer were performed by a water jetting method. The water jetting method was performed by spraying pressurized water at 1,000 atm so as to form an etching width of about 3 mm when the nozzle was moved once. More particularly, patterning was performed such that, as shown in FIG. 9, the light scattering layer and the planarization layer were removed firstly in one direction, and then, as shown in FIG. 10, the light scattering layer and the planarization layer were removed in another direction perpendicular to the above direction so as to form the remained light scattering layer and the planarization layer to have a rectangular form of about 5 cm in vertical length and about 5 cm in horizontal length in a center of the substrate. Subsequently, the electrode layer, the organic layer and the electrode layer were formed in the same manner as in Example 1, and the organic electronic device was prepared by attaching a glass can. In the above, the light-emitting area of the light-emitting layer of organic layer was formed to be rectangular at about 4 cm in vertical length and about 4 cm in horizontal length in the center of the substrate.

Comparative Example 1

The organic light-emitting device was prepared in the same manner as Example 1, except the light scattering layer and the planarization layer formed on the entire surface of the glass base layer were not removed, the ITO electrode layer was formed in that state, and the organic layer, the second electrode layer and the encapsulation structure were formed in this order to produce the organic light-emitting device.

Test Example

Measurement of Emission Status

Figure 11:
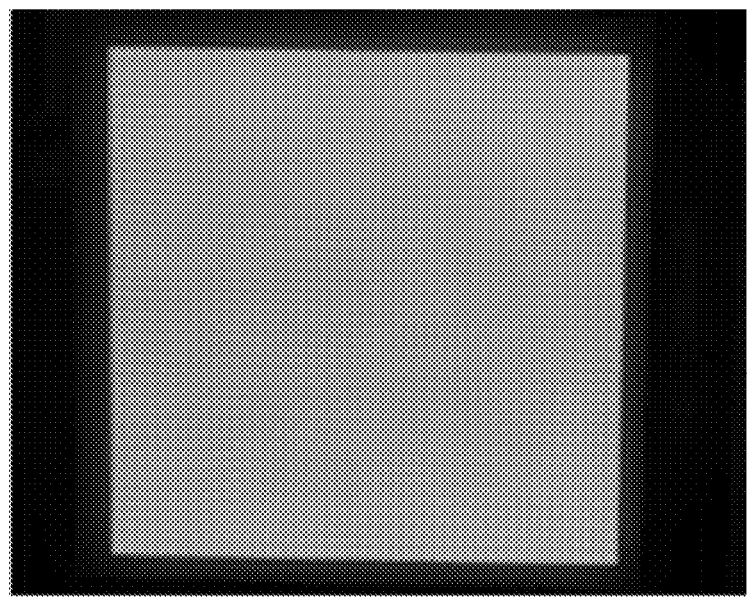
FIGS. 11 and 12 are images of the organic light-emitting devices whose durability was evaluated in Examples.
Figure 11:
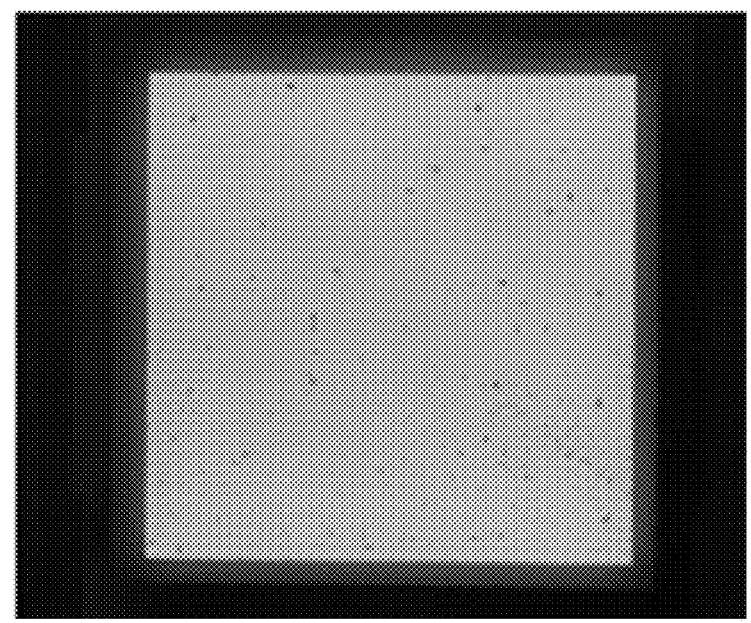
Figure 12:
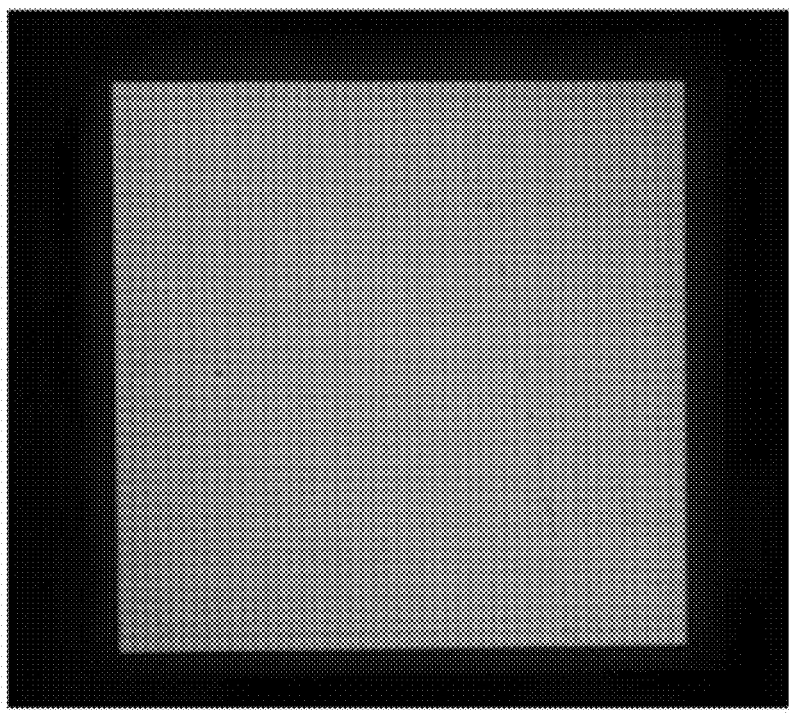
Figure 12:
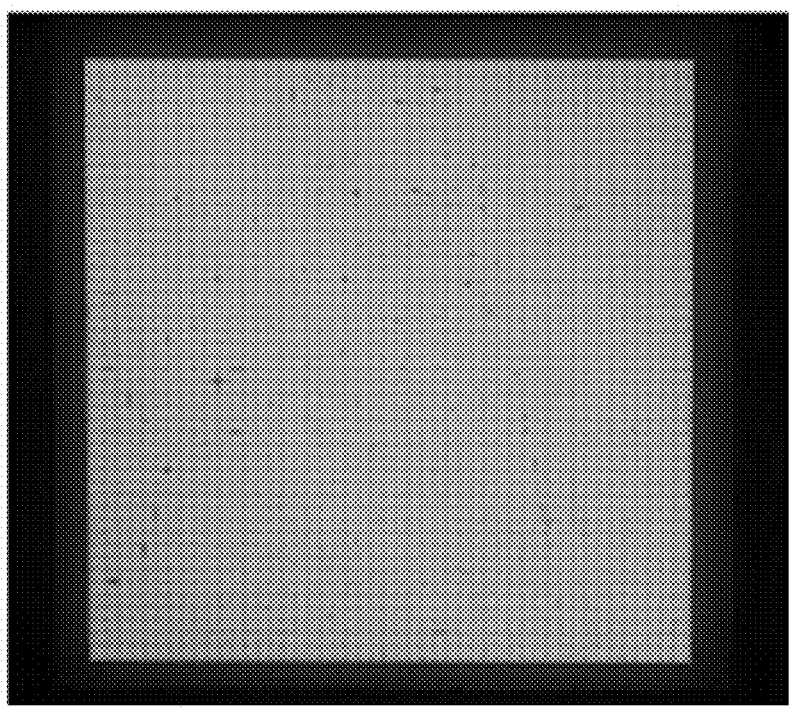
Figure 13:
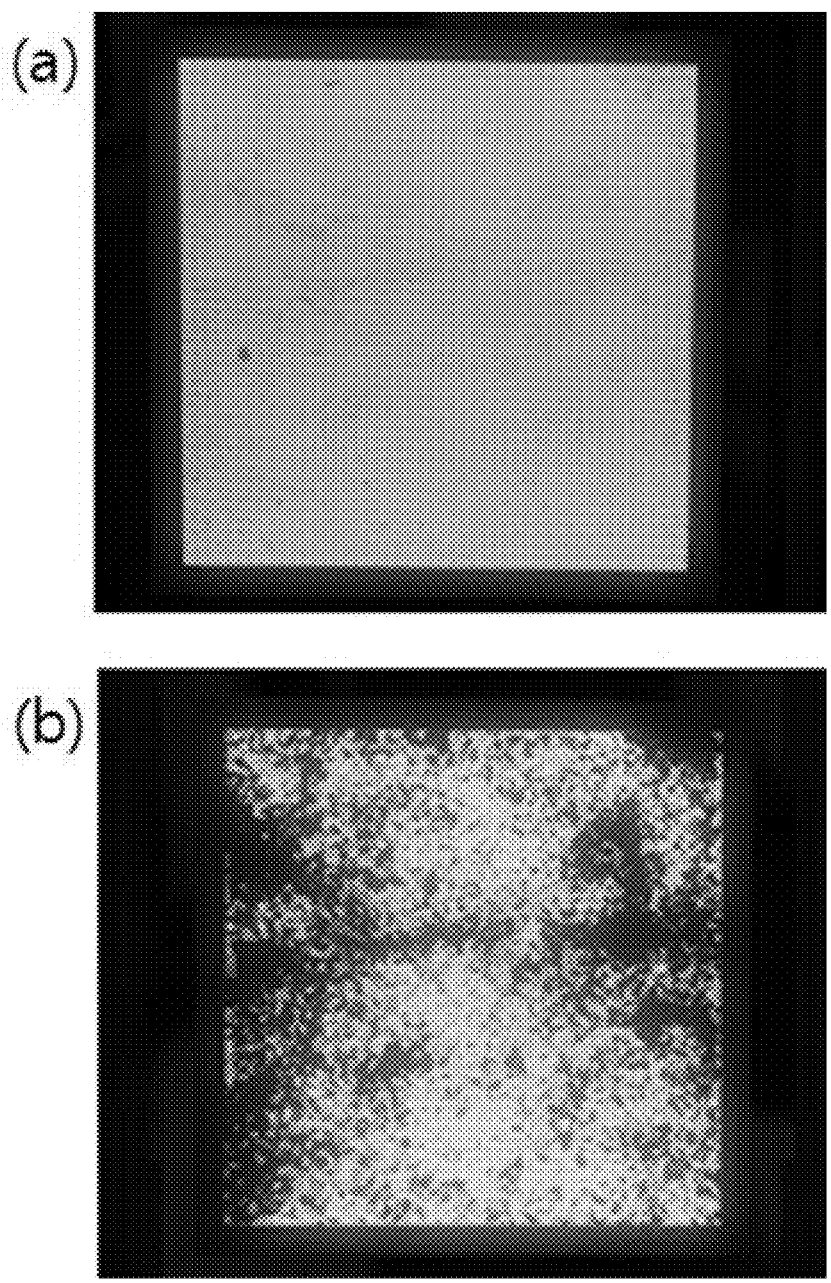
FIG. 13 is an image of the organic light-emitting device whose durability was evaluated in Comparative example.

After observing an initial emission status of the organic light-emitting device of Examples and Comparative example, each device was left for 500 hours at 85° C., and then the emission status was re-measured to determine durability. FIGS. 11 and 12 are drawings showing the initial emission status (FIGS. 11(*a*) and 12(*a*)) and the emission status after 500 hours at 85° C. (FIGS. 11(*b*) and 12(*b*)) of Examples 1 and 2, respectively, and FIG. 13 illustrates a drawing which shows the initial emission status (FIG. 13(*a*)) and the emission status after 500 hours at 85° C. (FIG. 13(*b*)) of Comparative example 1. From the drawings, in the case of Comparative example 1, many stains were observed after 500 hours, and thus drastic decrease of a brightness uniformity was confirmed.

DESCRIPTION OF THE MARKS IN THE DRAWING

101: the base layer
102: the electrode layer
103: the light scattering layer
1032: the scattering region
1032: the matrix material
401: the organic layer
402: the second electrode layer
403, 501: the encapsulation structure
404: the adhesive
502: the upper substrate

What is claimed is:

1. A substrate for an organic electronic device, comprising a base layer; a light scattering layer and an electrode layer in this order,
   wherein the light scattering layer contacts the base layer,
   wherein the electrode layer extends beyond the entire peripheries of the light scattering layer,
   wherein the light scattering layer comprises a matrix material and a scattering region, wherein the matrix material is a polysiloxane, a poly(amic acid), a polyimide, a cardo resin having a fluorene ring, urethane, epoxide, or a polyester or acrylate based thermo-curable or photo-curable monomeric, oligomeric or polymeric organic material,
   wherein a formation area of the electrode layer is broader than a formation area of the light scattering layer, and the electrode layer is formed also on the surface of the base layer on which the light scattering layer is not formed.

2. The substrate according to claim 1, wherein a ratio (A/B) of the formation area (A) of the electrode layer with respect to the formation area (B) of the light scattering layer is 1.04 to 2.0.

3. The substrate according to claim 1, wherein the base layer is transparent.

4. The substrate according to claim 1, wherein the electrode layer is an electrode layer capable of injecting a hole or an electrode layer capable of injecting an electron.

5. The substrate according to claim 1, wherein the light scattering region is a light scattering particle having a different refractive index from the matrix material.

6. The substrate according to claim 1, wherein the matrix material comprises polysiloxane, poly(amic acid) or polyimide.

7. The substrate according to claim 5, wherein the refractive index of the light scattering particle is in the range from 1.0 to 3.5.

8. The substrate according to claim 1, wherein the light scattering layer has a concavo-convex structure.

9. The substrate according to claim 1, further comprising a planarization layer between the light scattering layer and the electrode layer.

10. The substrate according to claim 9, wherein a refractive index of the planarization layer is 1.7 or more.

11. An organic electronic device comprising:
    a base layer;
    a light scattering layer formed on the base layer;
    a first electrode layer formed on the light scattering layer;
    an organic layer that is formed on the first electrode layer and that comprises a light-emitting layer;
    a second electrode layer formed on the organic layer; and
    an encapsulation structure which protects the organic layer and the second electrode layer,
    wherein a formation area of the first electrode layer is broader than a formation area of the light scattering layer, and the electrode layer is formed also on the surface of the base layer on which the light scattering layer is not formed, and
    wherein the bottom surface of encapsulation structure is attached to a top surface of the first electrode layer beneath which the light scattering layer is not formed.

12. The organic electronic device according to claim 11, wherein a difference (B-C) between a length (B) of the formation area of the light scattering layer and a length (C) of a light-emitting area of the light-emitting layer is in the range from 10 μm to 2 mm.

13. The organic electronic device according to claim 11, wherein the encapsulation structure is a glass can or a metal can.

14. The organic electronic device according to claim 11, wherein the encapsulation structure is a film covering the entire surface of the organic layer and the second electrode layer.

15. A method of preparing a substrate for an organic electronic device comprising providing a base laser; providing a light scattering layer and eliminating at least a part of a light scattering layer by processing the light scattering layer which is formed on the base layer; and forming an electrode layer on a region including the part where the light scattering layer is eliminated to form the electrode layer beyond the entire peripheries of the light scattering layer,
wherein the light scattering layer contacts the base layer,
wherein the light scattering layer comprises a matrix material and a scattering region, and
wherein the matrix material is a polysiloxane, a poly(amic acid), a polyimide, a cardo resin having a fluorene ring, urethane, epoxide, or a polyester or acrylate based thermo-curable or photo-curable monomeric, oligomeric or polymeric organic material.

16. The method according to claim 15, wherein the processing of the light scattering layer is performed by wet etching, dry etching, laser processing or a water jetting.

17. A lighting apparatus comprising the organic electronic device of claim 11.

* * * * *